(12) United States Patent
Ito

(10) Patent No.: US 11,784,078 B2
(45) Date of Patent: Oct. 10, 2023

(54) WAFER PLACEMENT APPARATUS

(71) Applicant: NGK INSULATORS, LTD., Nagoya (JP)

(72) Inventor: Joyo Ito, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 200 days.

(21) Appl. No.: 16/803,143

(22) Filed: Feb. 27, 2020

(65) Prior Publication Data

US 2020/0286755 A1    Sep. 10, 2020

(30) Foreign Application Priority Data

Mar. 4, 2019    (JP) .................................. 2019-038891

(51) Int. Cl.
*H01L 21/67* (2006.01)
*H01L 21/683* (2006.01)

(52) U.S. Cl.
CPC .... *H01L 21/6831* (2013.01); *H01L 21/67109* (2013.01)

(58) Field of Classification Search
CPC ............... C23C 16/463; H01L 21/6833; H01L 21/6831; H01L 21/67109; H01L 21/67103
See application file for complete search history.

(56) References Cited

U.S. PATENT DOCUMENTS

| 2004/0097088 | A1* | 5/2004 | Kitayama | H01L 21/67109 156/345.1 |
| 2014/0008020 | A1* | 1/2014 | Nagayama | H01J 37/32724 137/2 |
| 2014/0311728 | A1 | 10/2014 | Nonaka | |
| 2017/0032989 | A1 | 2/2017 | Chang | |
| 2018/0218886 | A1* | 8/2018 | Yamaguchi | H01L 21/6831 |
| 2020/0176230 | A1* | 6/2020 | Lu | H01L 21/67248 |

FOREIGN PATENT DOCUMENTS

| CN | 104282611 A | 1/2015 |
| CN | 108389771 A | 8/2018 |
| JP | 2002-217178 A | 8/2002 |
| JP | 2007-317772 A | 12/2007 |

(Continued)

OTHER PUBLICATIONS

Japanese Office Action (with English translation), Japanese Application No. 2019-038891, dated Nov. 15, 2022 (9 pages).

(Continued)

*Primary Examiner* — Aiden Lee

(74) *Attorney, Agent, or Firm* — BURR PATENT LAW, PLLC

(57) ABSTRACT

A wafer placement apparatus includes a ceramic plate having a top surface including a wafer placement surface, the ceramic plate allowing at least one of an electrostatic electrode and a heater electrode to be embedded therein; and a cooling plate disposed on an undersurface of the ceramic plate opposite to the wafer placement surface to cool the ceramic plate, wherein the cooling plate includes a coolant channel, and the coolant channel has a multi-layer structure at least partially including two or more layers stacked vertically, the two or more layers being spaced different distances apart from the wafer placement surface.

3 Claims, 5 Drawing Sheets

(56) References Cited

FOREIGN PATENT DOCUMENTS

| | | |
|---|---|---|
| JP | 2012-142413 A | 7/2012 |
| JP | 2012-248693 A | 12/2012 |
| JP | 2013-026387 A | 2/2013 |
| JP | 2015-035448 A | 2/2015 |
| JP | 2018-006768 A1 | 1/2018 |
| TW | 201705351 A | 2/2017 |

OTHER PUBLICATIONS

Taiwanese Patent Office Notification dated Apr. 27, 2023 (Application No. 109106876).
Taiwanese Office Action dated Mar. 2, 2023 (Application No. 109106876).
Chinese Office Action dated Jun. 5, 2023 (Application No. 202010143272.2).

* cited by examiner

WAFER PLACEMENT APPARATUS

BACKGROUND OF THE INVENTION

1. Field of the Invention

The present invention relates to a wafer placement apparatus.

2. Description of the Related Art

A known example of a wafer placement apparatus includes, on its top surface, a ceramic plate having a wafer placement surface, and, on its undersurface of the ceramic plate opposite to the wafer placement surface, a cooling plate having a coolant channel. The coolant channel in the cooling plate usually has a single layer. As an example of a device having a coolant channel not formed from a single layer, PTL 1 discloses an electrostatic chuck in which a ceramic plate includes an electrostatic electrode and a heater electrode, and the cooling plate includes a heater sheath electrode and coolant channels above and below the sheath electrode. To raise the temperature of a wafer, this electrostatic chuck causes the sheath electrode to generate heat, and causes a coolant to flow through the lower coolant channel. Thus, the temperature of the electrostatic chuck is appropriately lowered to stabilize the temperature of the entirety of the electrostatic chuck. To lower the temperature of the wafer, on the other hand, heat generation of the sheath electrode is stopped, and a coolant is caused to flow through the upper coolant channel. Thus, the wafer can be quickly cooled, and the temperature drop characteristics are improved.

CITATION LIST

Patent Literature

PTL 1: Japanese Unexamined Patent Application Publication No. 2018-6768

SUMMARY OF THE INVENTION

In the case of a coolant channel formed from a single layer, however, a coolant has a temperature difference between at the inlet port and the outlet port, and sometimes prevents the wafer to have a uniform temperature. In PTL 1, the cooling plate includes a sheath electrode having inferior thermal conductivity than the cooling plate body, and may have a inferior cooling efficiency. The difference in temperature drop efficiency between portions of the cooling plate where the sheath electrode is disposed and not disposed prevents the wafer to have a uniform temperature.

The present invention was made to solve these problems, and mainly aims to enhance the temperature uniformity and the efficiency of cooling a wafer.

A wafer placement apparatus according to the present invention includes a ceramic plate having a top surface including a wafer placement surface, the ceramic plate allowing at least one of an electrostatic electrode and a heater electrode to be embedded therein; and a cooling plate disposed on an undersurface of the ceramic plate opposite to the wafer placement surface to cool the ceramic plate. The cooling plate includes a coolant channel, and the coolant channel has a multi-layer structure at least partially including two or more layers stacked vertically, the two or more layers being spaced different distances apart from the wafer placement surface.

In this wafer placement apparatus, at least part of the coolant channel included in the cooling plate has a multi-layer structure including two or more layers stacked vertically. This structure increases the range of channel layout variation compared to the case of a single layer, and can compensate insufficient cooling using a single layer with cooling using another layer. The cooling plate cools the ceramic plate instead of heating the ceramic plate, and does not require a sheath electrode, as in the case of PTL 1. Thus, this structure can enhance the temperature uniformity and the efficiency of cooling the wafer.

Herein, "above" or "below" does not represent the absolute positional relationship, but represents a relative positional relationship. Thus, depending on the orientation of the wafer placement apparatus, "above" or "below" can be switched to "left" or "right", or "front" or "rear".

In this wafer placement apparatus, one of the layers of the coolant channel located closer to the ceramic plate may have an inter-channel distance, a channel width, and a channel cross section at least one of which is smaller than a corresponding one of an inter-channel distance, a channel width, and a channel cross section of another one of the layers located further from the ceramic plate. The layer of the coolant channel closer to the ceramic plate is more likely to affect the temperature of a wafer, and thus appropriate for fine adjustment of the temperature. Thus, when the layer of the coolant channel closer to the ceramic plate has the inter-channel distance, the channel width, and the channel cross section at least one of which is smaller than the at least one of those of the other layer, fine adjustment of the temperature can be facilitated, and the temperature uniformity of the wafer can be further enhanced.

In this wafer placement apparatus, one of the layers of the coolant channel located closer to the ceramic plate may be independently disposed in each of zones into which the cooling plate is divided. When the coolant channel is independently disposed for each zone, the temperature can be individually adjusted for each zone. Particularly, the layer of the coolant channel closer to the ceramic plate appropriate for fine adjustment of the temperature is independently disposed for each zone. Thus, fine adjustment of the temperature can be facilitated, and the temperature uniformity of the wafer can be further enhanced.

In this wafer placement apparatus, the cooling plate may have a through-hole that extends through vertically, and around the through-hole, one of the layers of the coolant channel located closer to the ceramic plate may be located closer to the through-hole than another one of the layers located further from the ceramic plate. The portion of the cooling plate around the through-hole has temperature drop that significantly differs from that of other portions, and thus has its temperature not easily adjusted finely. However, when the layer of the coolant channel closer to the ceramic plate appropriate for fine adjustment of the temperature is located close to the through-hole, fine adjustment of the temperature can be facilitated, and the temperature uniformity of the wafer can be further enhanced.

In this wafer placement apparatus, the coolant channel may include a layer located closer to the ceramic plate and a layer located further from the ceramic plate, which are alternately arranged when viewed in a plan. This structure can compensate insufficient cooling of a portion of a layer where no coolant channel is disposed with cooling using a coolant channel of another layer. Thus, the temperature uniformity of the wafer can be further enhanced.

In this wafer placement apparatus, a layer of the coolant channel located closer to the ceramic plate on a first side of a border of multiple zones into which the cooling plate is divided, and a layer of the coolant channel located further from the ceramic plate on a second side of the border may be continuous at a first communication portion, and a layer located further from the ceramic plate on the first side of the border and a layer located closer to the ceramic plate on the second side of the border may be continuous at a second communication portion, so that the layers may be vertically switched with each other. The layer of the coolant channel closer to the ceramic plate receives a larger amount of heat from the ceramic plate than the layer of the coolant channel located further from the ceramic plate, and thus the temperature distribution of the coolant is more likely to increase. In the case where the layers of the coolant channel are vertically switched in the middle, a large amount of heat is dispersed into multiple channels. Although the temperature distribution of the coolant passing through the layer further from the ceramic plate increases further than in the case where the layers are not vertically switched, the temperature distribution of the coolant passing through the layer further from the ceramic plate that is more likely to affect the temperature of the wafer is reduced, so that the uniformity of the temperature of the wafer can be further enhanced.

In this wafer placement apparatus, one of the layers of the coolant channel located further from the ceramic plate has an outlet port disposed near an inlet port of another one of the layers located closer to the ceramic plate, and an inlet port disposed near an outlet port of the layer located closer to the ceramic plate, when the cooling plate is viewed in a plan. The temperature of the coolant in the coolant channel is more likely to rise upon receipt of heat from the ceramic plate, directing from the inlet port toward the outlet port. Thus, when, for example, the inlet port of the layer closer to the ceramic plate is located at the outer periphery and the outlet port of the layer is located at the center, the coolant in the layer closer to the ceramic plate is hotter at the center than at the outer periphery, and the coolant undergoes inefficient temperature drop at the center. To address this, the inlet port and the outlet port are reversed in the layer further from the ceramic plate to improve the temperature drop at the center than at the outer periphery, to cancel the inefficient temperature drop at the center of the layer closer to the ceramic plate. On the other hand, the inefficient temperature drop at the outer periphery of the layer further from the ceramic plate can be cancelled by the efficiency of the temperature drop at the outer periphery of the layer closer to the ceramic plate. Thus, the temperature uniformity of the wafer can be further enhanced.

In this wafer placement apparatus, the cooling plate may have no heater. Thus, the efficiency of cooling a component for a heater or the temperature uniformity can be prevented from being reduced.

DETAILED DESCRIPTION OF THE INVENTION

Figure 1:
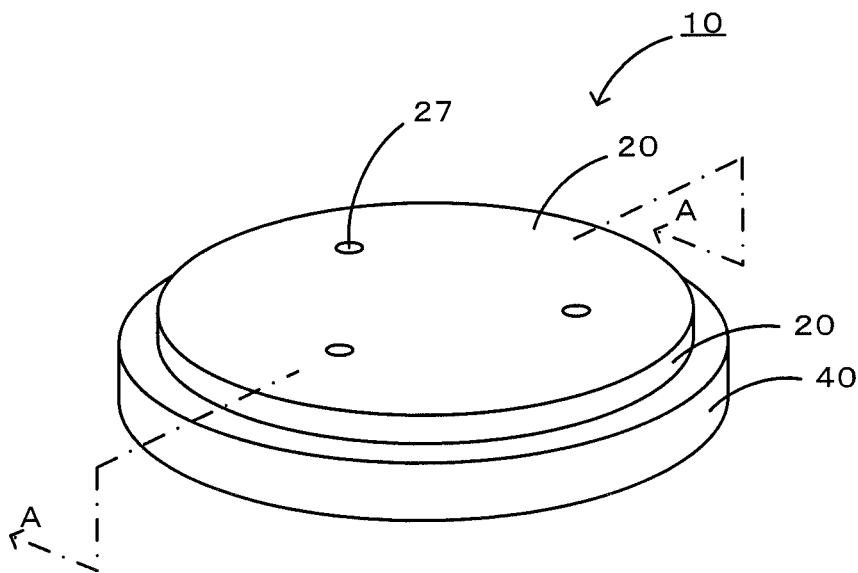
FIG. 1 is a perspective view of an electrostatic chuck heater 10.
Figure 2:
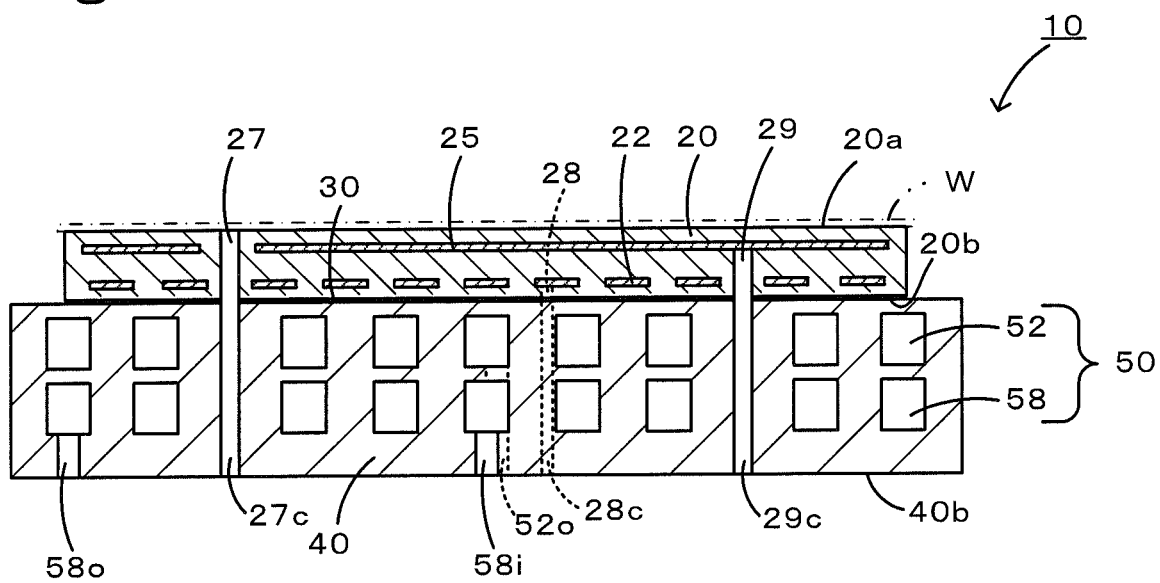
FIG. 2 is a cross-sectional view taken along line A-A of FIG. 1.
Figure 3:
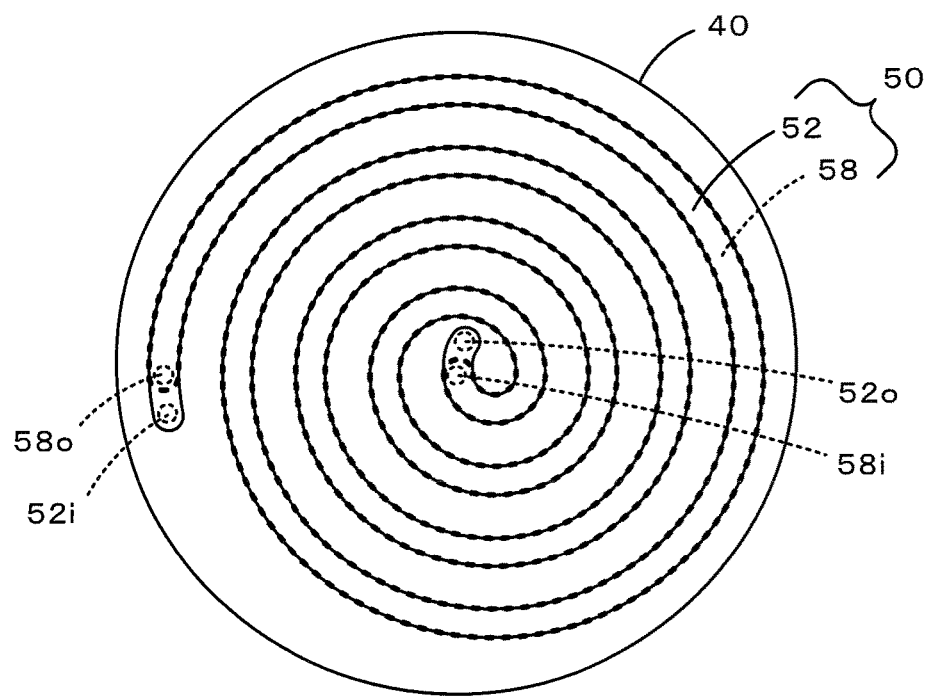
FIG. 3 illustrates a coolant channel 50 when viewed in a plan.

Preferable embodiments of the present invention will be described below with reference to the drawings. FIG. 1 is a perspective view of an electrostatic chuck heater 10. FIG. 2 is a cross-sectional view taken along line A-A of FIG. 1. FIG. 3 illustrates a coolant channel 50 when viewed in a plan.

The electrostatic chuck heater 10 includes, on its top surface, a ceramic plate 20 having a wafer placement surface 20a, and a cooling plate 40 on an undersurface 20b of the ceramic plate 20, opposite to the wafer placement surface 20a. The ceramic plate 20 and the cooling plate 40 are joined together with an insulating adhesive sheet 30. The electrostatic chuck heater 10 has a hole 27 that extends through in the vertical direction. When a lift pin inserted into the hole 27 is raised, a wafer W placed on the wafer placement surface 20a of the ceramic plate 20 can be raised. The surface of a through-hole 27c of the hole 27 that extends through the cooling plate 40 is covered with insulation, not illustrated.

The ceramic plate 20 is a disc-shaped plate made of ceramics such as an aluminium nitride or alumina. The ceramic plate 20 includes a heater electrode 22 and an electrostatic electrode 25. The heater electrode 22 is formed from, for example, a coil or a printed pattern mainly composed of molybdenum, tungsten, or a tungsten carbide. The heater electrode 22 is wired in a unicursal manner from a first end to a second end throughout the entirety of the disk-shaped ceramic plate 20. The first end and the second end of the heater electrode 22 are connected to a pair of feeder rods, not illustrated, inserted through a hole 28 formed in an undersurface 40b of the cooling plate 40. The electrostatic electrode 25 is formed from, for example, a mesh or plate mainly composed of molybdenum, tungsten, or a tungsten carbide, and disposed parallel to the wafer placement surface 20a of the ceramic plate 20. The electrostatic electrode 25 is connected to a feeder rod, not illustrated, inserted into a hole 29. Each of the holes 28 and 29 includes a closed-end hole extending from an opening of the undersurface 20b of the ceramic plate 20 to the heater electrode 22 or the electrostatic electrode 25, a through-hole that extends through the adhesive sheet 30, and through-hole 28c or 29c that vertically extends through the cooling plate 40. The closed-end hole, the through-hole, and the through-hole 28c or 29c are continuous with each other. The surfaces of the through-holes 28c and 29c of the holes 28 and 29 that extend through the cooling plate 40 are covered with insulation, not illustrated.

The cooling plate 40 is a disk-shaped plate made of metal such as aluminium or an aluminium alloy, and has a coolant channel 50 inside, throughout the area over which the ceramic plate 20 is disposed. The coolant channel 50 has a multi-layer structure having an upper layer channel 52 and a lower layer channel 58, located further from the wafer placement surface 20*a* than the upper layer channel 52.

The upper layer channel 52 is disposed in a unicursal manner throughout the entire area over which the ceramic plate 20 is disposed. Specifically, the upper layer channel 52 is spirally arranged from an inlet port 52*i*, at the outer periphery, to an outlet port 52*o*, at the center (refer to FIG. 3). The inlet port 52*i* and the outlet port 52*o* are connected to an upper coolant cooler, not illustrated. The coolant discharged from the outlet port 52*o* is subjected to temperature adjustment by the upper coolant cooler, and then returned to the inlet port 52*i* to be fed into the upper layer channel 52.

The lower layer channel 58 is disposed in a unicursal manner throughout the entire area over which the ceramic plate 20 is disposed. Specifically, the lower layer channel 58 is spirally disposed from an inlet port 58*i*, at the center, to an outlet port 58*o*, at the outer periphery (refer to FIG. 3). Except that the inlet port 58*i* and the outlet port 58*o* are arranged so as not to interfere with the inlet port 52*i* and the outlet port 52*o* of the upper layer channel 52, the lower layer channel 58 has the same cross section as the upper layer channel 52, and is disposed to overlap the upper layer channel 52 when viewed in a plan. The inlet port 58*i* and the outlet port 58*o* of the lower layer channel 58 are connected to a lower coolant cooler, not illustrated. The coolant discharged from the outlet port 58*o* is subjected to temperature adjustment at the lower coolant cooler, and then returned to the inlet port 58*i* to be fed into the lower layer channel 58.

Subsequently, an example of use of the electrostatic chuck heater 10 according to the present embodiment will be described. Firstly, a wafer W is placed on the wafer placement surface 20*a* of the electrostatic chuck heater 10, and a voltage is exerted on the electrostatic electrode 25 to attract the wafer W to the ceramic plate 20 with electrostatic force. In this state, the wafer W is subjected to, for example, plasma CVD deposition or plasma etching. Here, the temperature of the wafer W is controlled by applying a voltage to the heater electrode 22 to heat the wafer W, or circulating a coolant such as water in the coolant channel 50 in the cooling plate 40 to cool the wafer W. The upper layer channel 52 and the lower layer channel 58 of the coolant channel 50 are respectively connected to the upper coolant cooler and the lower coolant cooler, which are different coolant coolers, to independently control the temperature of the coolants circulating in the respective channels 52 and 58. After the processing on the wafer W is finished, the voltage across the electrostatic electrode 25 and the wafer W is dropped to zero to extinguish the electrostatic force, and the lift pin, not illustrated, inserted into the hole 29 is brought upward to raise the wafer W upward with the lift pin from the wafer placement surface 20*a* of the ceramic plate 20. The wafer W raised by the lift pin is transported to another place by a transport device, not illustrated.

The above-described electrostatic chuck heater 10 according to the present embodiment has a multi-layer structure in which the coolant channel 50 has upper and lower layers in the cooling plate 40. This structure increases the range of channel layout variation compared to the case of a single layer, and can compensate insufficient cooling using a single layer with cooling using another layer. The cooling plate 40 cools the ceramic plate 20 instead of heating the ceramic plate 20, and does not require, for example, a sheath electrode for a heater. Thus, the coolant channel 50 having a multi-layer structure can be disposed in the cooling plate 40 having an integrated structure, has efficient temperature uniformity, and can enhance the temperature uniformity and the efficiency of cooling the wafer W.

When the cooling plate 40 is viewed in a plan, the coolant channel 50 has the lower layer channel 58 having the outlet port 58*o* disposed adjacent to the inlet port 52*i* (outer periphery) of the upper layer channel 52, and the inlet port 58*i* disposed adjacent to the outlet port 52*o* (center) of the upper layer channel 52. The temperature of the coolant in the coolant channel is more likely to rise upon receipt of heat from the ceramic plate 20, directing from the inlet port toward the outlet port (heat generated during plasma processing of the wafer W or heat generated by power introduction to the heater electrode 22). Thus, in the upper layer channel 52, the coolant is hotter at the center than at the outer periphery, and the coolant undergoes inefficient temperature drop at the center. In the lower layer channel 58, the inlet port and the outlet port are arranged opposite to those of the upper layer channel 52 to improve the temperature drop at the center than at the outer periphery, to cancel the inefficient temperature drop at the center of the upper layer channel 52. On the other hand, the inefficient temperature drop at the outer periphery of the lower layer channel 58 can be cancelled by the efficiency of the temperature drop at the outer periphery of the upper layer channel 52. Thus, the temperature uniformity in the in-plane direction of the cooling plate 40 can be further enhanced, so that the temperature uniformity of the wafer W can be further enhanced. The upper layer channel 52 and the lower layer channel 58 are arranged to overlap each other when viewed in a plan, and the coolants in the upper layer channel 52 and the lower layer channel 58 flow in opposite directions throughout the channels 52 and 58. Thus, these effects can be expected throughout the channels.

The present invention is not limited to the above-described embodiments, and can be naturally embodied in various forms as long as they belong to the technical scope of the present invention.

Figure 4:
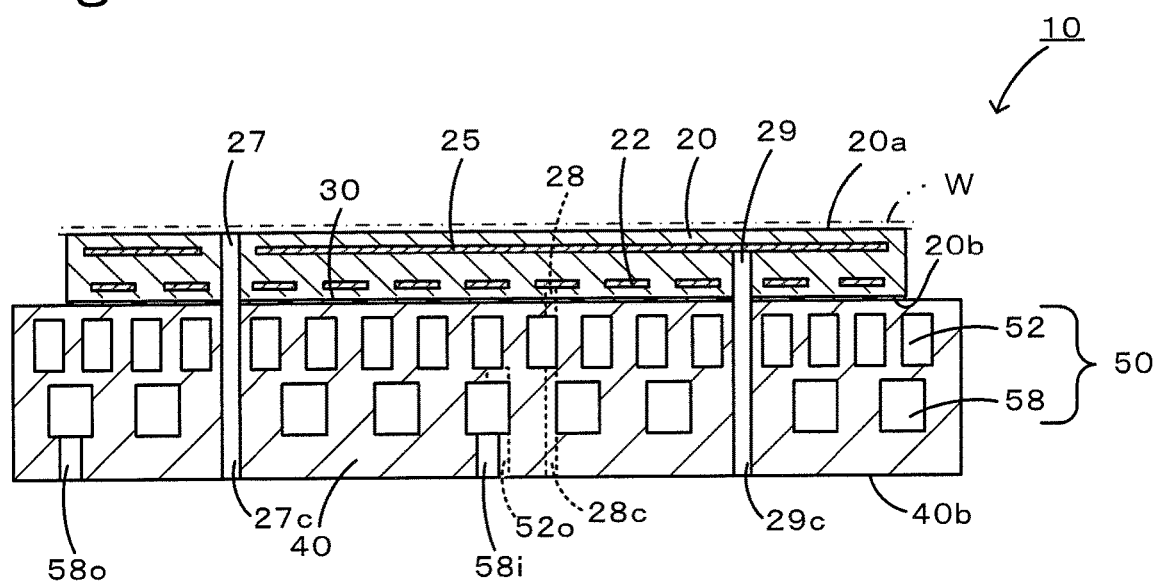
FIG. 4 is a cross-sectional view of another example of the electrostatic chuck heater 10 taken along line A-A.

For example, in the above-described embodiments, the upper layer channel 52 has the same cross section, the same inter-channel distance, and the same channel width as the lower layer channel 58. However, the upper layer channel 52 is not limited to this. For example, as illustrated in FIG. 4, the upper layer channel 52 may have a smaller inter-channel distance, a smaller channel width, and a smaller channel cross section than the lower layer channel 58. The upper layer channel 52 is more likely to affect the temperature of the wafer W than the lower layer channel 58, and is thus appropriate for fine adjustment of the temperature. Thus, reduction of the inter-channel distance, the channel width, and the channel cross section of the upper layer channel 52 further than those of the lower layer channel 58 can facilitate fine adjustment of the temperature and further enhance the temperature uniformity of the wafer W. In FIG. 4, the upper layer channel 52 has a smaller inter-channel distance and a smaller channel width than the lower layer channel 58, and is arranged more finely throughout the entire area over which the ceramic plate 20 is disposed. Thus, the fine adjustment of the temperature can be facilitated throughout the entire area over which the ceramic plate 20 is disposed. In FIG. 4, the upper layer channel 52 has a smaller inter-channel distance than the lower layer channel 58 around the through-hole 27*c*, and is arranged adjacent to the through-hole 27*c*. The portion of the cooling plate 40 around the through-hole 27*c* is more likely to have inferior temperature drop than other portions. However, the upper layer channel 52 that is more likely to affect the temperature of the wafer W is located adjacent to the through-hole 27*c*, can efficiently cool the periphery of the through-hole 27c, and thus facilitates fine adjustment of the temperature. This holds true for the through-holes 28c and 29c. In FIG. 4, the upper layer channel 52 has a smaller channel width than the lower layer channel 58 around the through-hole 27c. The portion of the cooling plate 40 around the through-hole 27c undergoes a temperature drop that significantly differs from that at other portions, and has its temperature not easily adjusted finely. However, the upper layer channel 52 appropriate for fine adjustment of the temperature has a small channel width and enables local cooling, and facilitates fine adjustment of the temperature. This holds true for the through-holes 28c and 29c. In FIG. 4, the upper layer channel 52 has a smaller channel cross section than the lower layer channel 58. Thus, performing main cooling at the lower layer channel 58 and performing sub-cooling at the upper layer channel 52 facilitate fine adjustment of the temperature. The upper layer channel 52 may have at least one of the inter-channel distance, the channel width, and the channel cross section smaller than the lower layer channel 58.

Figure 5:
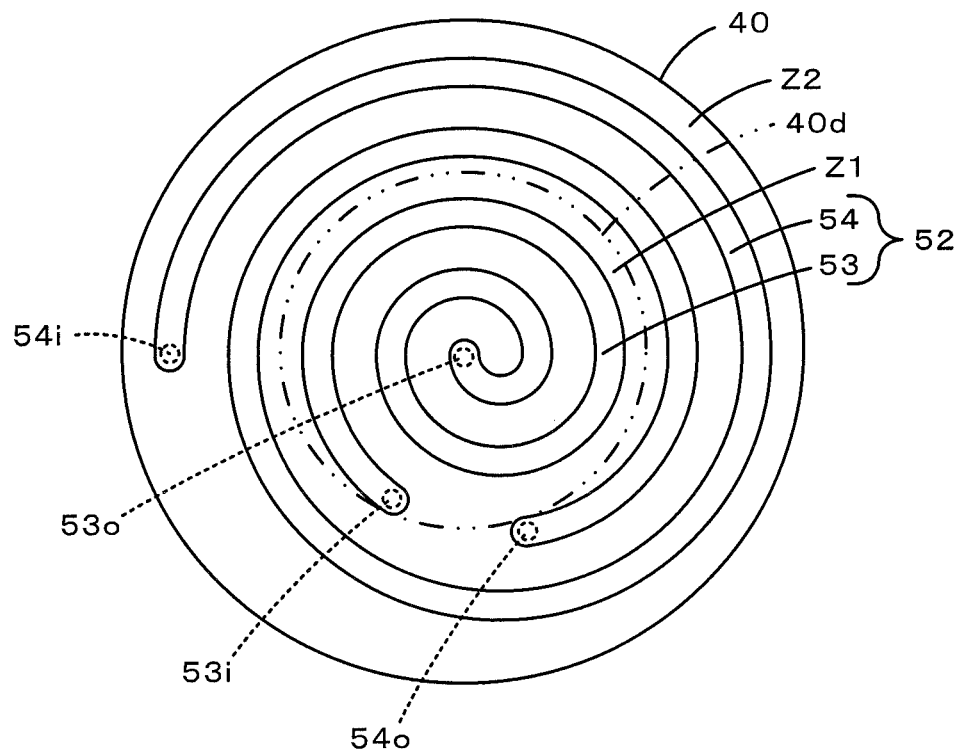
FIG. 5 illustrates another example of an upper layer channel 52 when viewed in a plan.

In the above-described embodiments, the upper layer channel 52 may be individually disposed in each of multiple zones into which the cooling plate 40 is divided. For example, as illustrated in FIG. 5, an inner channel 53 may be disposed in a circular inner zone Z1 (on the inner side of a border 40d in FIG. 5), and an outer channel 54 may be disposed in an annular outer zone Z2 (on the outer side of the border 40d in FIG. 5) surrounding the inner zone Z1. The inner zone Z1 is a circular zone concentric with the cooling plate 40, and having a smaller diameter than the cooling plate 40. The inner channel 53 is arranged in a unicursal manner throughout the entire area of the inner zone Z1. Specifically, the inner channel 53 is spirally arranged from an inlet port 53i at the outer periphery to an outlet port 53o at the center. The outer channel 54 is arranged in a unicursal manner throughout the entire area of the outer zone Z2. Specifically, the outer channel 54 is spirally arranged from an inlet port 54i at the outer periphery to an outlet port 54o at the inner periphery. The inlet port 53i and the outlet port 53o of the inner channel 53 are connected to a coolant cooler different from a coolant cooler to which the inlet port 54i and the outlet port 54o of the outer channel 54 are connected. The temperatures of the coolants circulating the channels 53 and 54 are independently controlled. Thus, the temperature can be separately adjusted for each zone. Particularly, the upper layer channel 52 appropriate for fine adjustment of the temperature is divided into separate zones. This structure can thus facilitate fine adjustment of the temperature, and further enhance the uniformity of the temperature of the wafer W. In FIG. 5, the cooling plate 40 is divided into two zones, that is, the inner zone Z1 and the outer zone Z2, in which the channels 53 and 54 are respectively disposed. However, the cooling plate 40 may be divided into three or more zones in each of which the channel is disposed. The shape of each zone is not limited to a particular one. Each zone may have, for example, a circular, annular, semicircular, sector, or arc shape. As in the case of the upper layer channel 52, the lower layer channel 58 may be individually disposed in each of multiple separate zones into which the cooling plate 40 is divided. When the number of zones m (m≥1) for the upper layer channel 52 appropriate for fine adjustment of the temperature is larger than the number of zones n (n≥1) for the lower layer channel 58, the temperature of the wafer W can be adjusted more finely.

Figure 6:
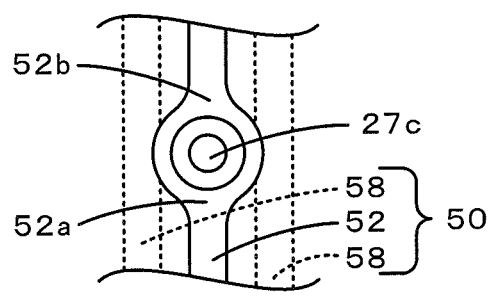
FIG. 6 illustrates a layout of the coolant channel 50 around a through-hole 27c.

In the above-described embodiments, as illustrated in FIG. 6, the upper layer channel 52 may bifurcate into two parts at a branch point 52a in front of the through-hole 27c, and may be merged into one part at a juncture 52b at the back of the through-hole 27c. In FIG. 6, the upper layer channel 52 can be brought close to the through-hole 27c than the lower layer channel 58, throughout the entire surroundings of the through-hole 27c, instead of only on both sides of the through-hole 27c. The portion of the cooling plate 40 around the through-hole 27c undergoes temperature drop that significantly differs from that at other points, and has thus its temperature not easily adjusted finely. However, the upper layer channel 52 located adjacent to the through-hole 27c can have its temperature more easily adjusted finely, and enhance the uniformity of the temperature of the wafer W. Particularly, in FIG. 6, the upper layer channel 52 is arranged to surround the entire periphery of the through-hole 27c, and thus can further enhance the temperature uniformity around the through-hole 27c. This holds true for the through-holes 28c and 29c. As in the case of the upper layer channel 52, the lower layer channel 58 may also bifurcate into two sections at a branch point in front of the through-hole, and may be merged into one at a juncture at the back of the through-hole.

Figure 7:
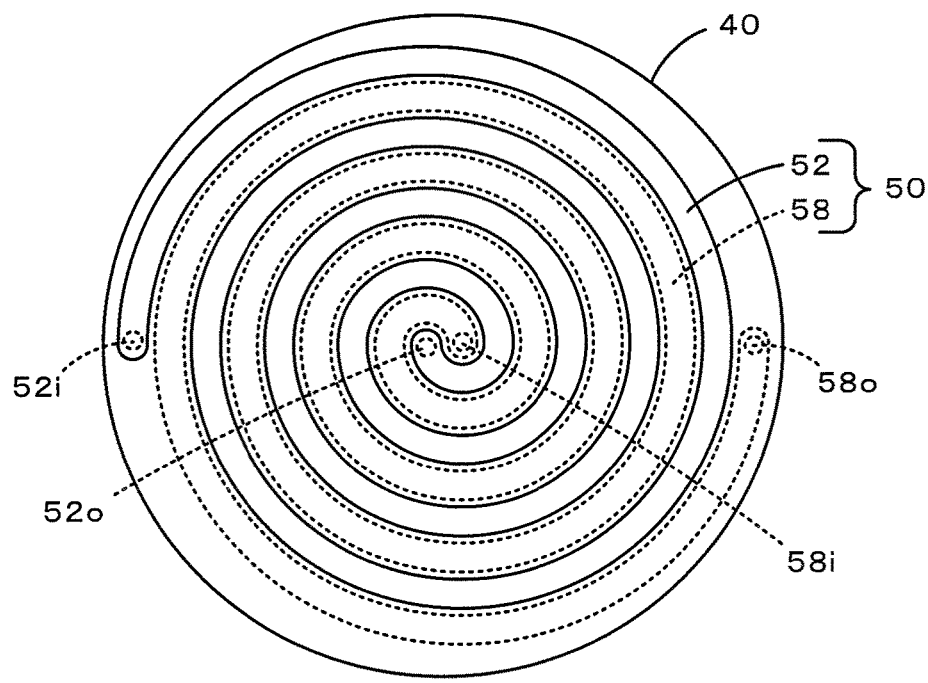
FIG. 7 illustrates another example of the coolant channel 50 when viewed in a plan.

In the above-described embodiment, the upper layer channel 52 and the lower layer channel 58 overlap each other when viewed in a plan, but the present invention is not limited to these. For example, as illustrated in FIG. 7, the upper layer channel 52 and the lower layer channel 58 may be alternately arranged when viewed in a plan. Here, cooling of the portion where no upper layer channel 52 is disposed can be compensated by the lower layer channel 58, and cooling of the portion where no lower layer channel 58 is disposed can be compensated by the upper layer channel 52. Thus, the temperature uniformity of the wafer can be enhanced.

Figure 8:
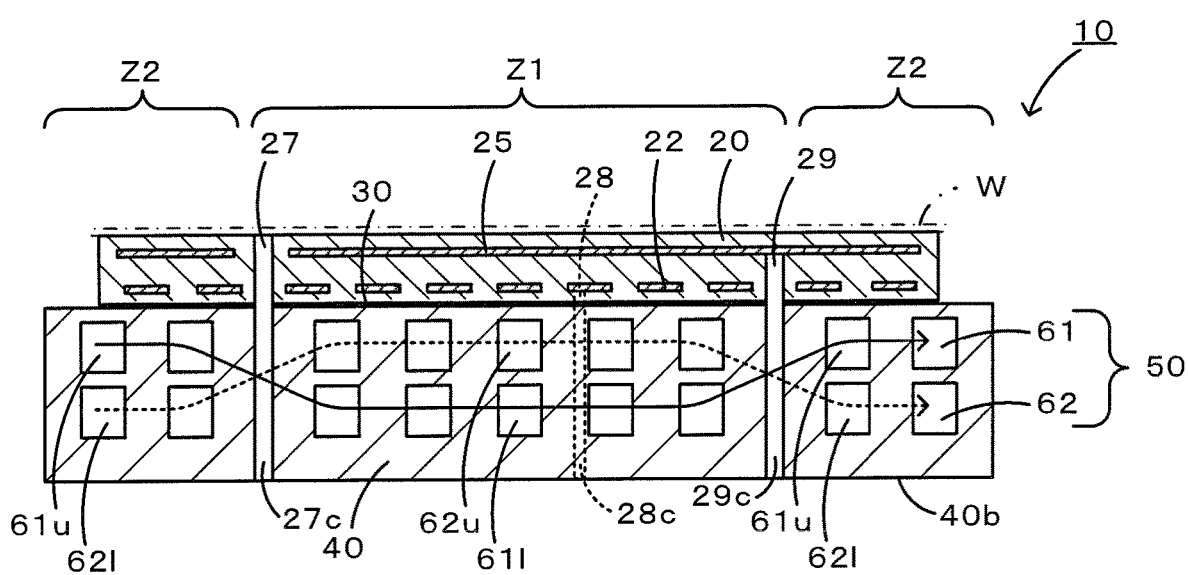
FIG. 8 is a cross-sectional view of another example of the electrostatic chuck heater 10 taken along line A-A.
Figure 9:
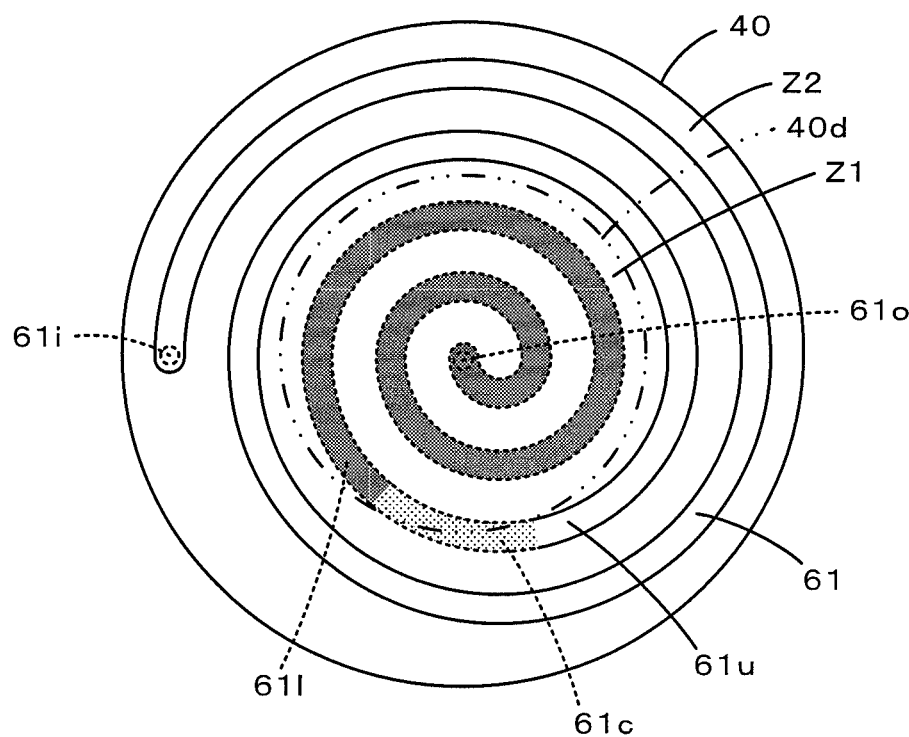
FIG. 9 illustrates a first channel 61 when viewed in a plan.
Figure 10:
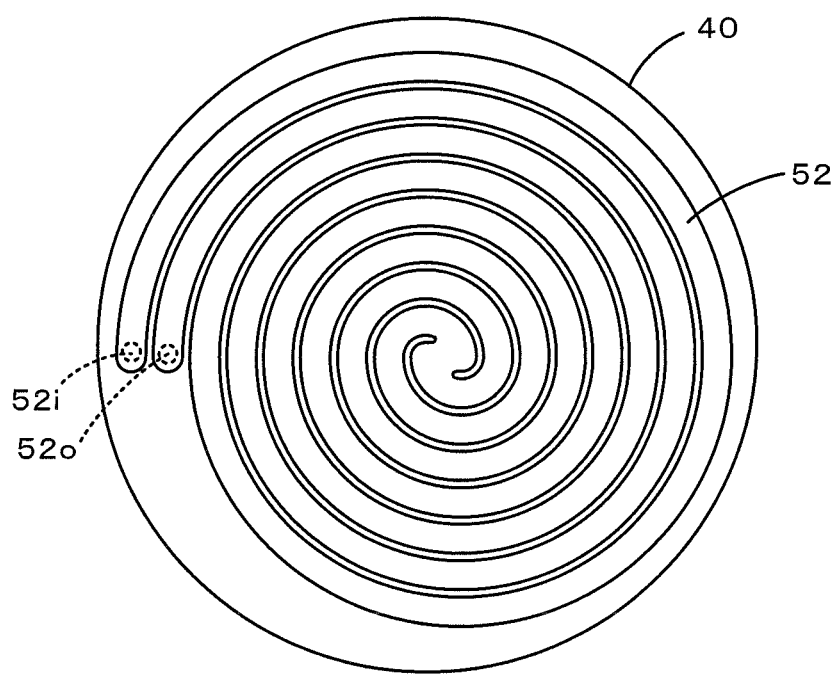
FIG. 10 illustrates another example of an upper layer channel 52 when viewed in a plan.

In the above-described embodiment, the coolant channel 50 includes the upper layer channel 52 located adjacent to the ceramic plate 20, and the lower layer channel 58 located away from the ceramic plate 20, while this layout is unchanged vertically. However, the channels may be vertically switched between each other in the middle. For example, as illustrated in FIG. 8, the coolant channel 50 may include a first channel 61 and a second channel 62, and the first channel 61 and the second channel 62 may be vertically switched between each other at the border 40d between the inner zone Z1 and the outer zone Z2. In the outer zone Z2, the first channel 61 is arranged adjacent to the ceramic plate 20 (upper layer 61u). In the inner zone Z1, the first channel 61 is arranged further from the ceramic plate 20 (lower layer 61l). As illustrated in FIG. 9, the first channel 61 is spirally arranged from an inlet port 61i at the outer periphery to an outlet port 61o at the center. The upper layer 61u is disposed to coincide with the outer channel 54 illustrated in FIG. 5 when viewed in a plan, the lower layer 61l is disposed to coincide with the inner channel 53 illustrated in FIG. 5 when viewed in a plan, and the inner peripheral end of the upper layer 61u and the outer peripheral end of the lower layer 61l are connected with each other with a first communication portion 61c. In FIG. 9, the lower layer 61l is thickly hatched and the communication portion 61c is thinly hatched. The upper layer 61u is represented with white. The second channel 62 is disposed away from the ceramic plate 20 in the outer zone Z2 (lower layer 62l), and disposed adjacent to the ceramic plate 20 in the inner zone Z1 (upper layer 62u). The second channel 62 is spirally arranged from an inlet port at the center to an outlet port at the outer periphery. The upper layer 62u is disposed to coincide with the lower layer 61l of the first channel 61 when viewed in a plan, the lower layer 62l is disposed to coincide with the upper layer 61u of the first channel 61 when viewed in a plan, and the outer peripheral end of the upper layer 62u and the inner peripheral end of the lower layer 62l are connected with each other with a second communication portion (not illustrated). In order not to interfere with the first communication portion 61c, the second communication portion is disposed to, for example, detour around the first communication portion 61c. The first channel 61 and the second channel 62 are respectively connected to a first coolant cooler and a second coolant cooler, which are different coolant coolers, so that the temperatures of the coolants that circulate through the channels 61 and 62 are separately controlled. The layer of the coolant channel 50 located adjacent to the ceramic plate 20 receives a large amount of heat from the ceramic plate 20 than the layer of the coolant channel 50 located further from the ceramic plate 20, and thus the temperature distribution of the coolant in the channel is more likely to increase. In the case where the layers of the coolant channel 50 are vertically switched in the middle, as in the case of FIG. 8, a large amount of heat is dispersed into multiple channels. Although the temperature distribution of the coolant over the entire lower layers 61l and 62l increases further than in the case where the layers are not vertically switched, the temperature distribution of the coolant in the entire upper layers 61u and 62u that are more likely to affect the temperature of the wafer W is reduced, so that the uniformity of the temperature of the wafer W can be further enhanced. In FIG. 8, the first channel 61 and the second channel 62 have the same channel cross section, but may have different cross sections. In this case, while having a substantially uniform channel cross section, the channels 61 and 62 allow the coolant to keep flowing smoothly, and the upper layer of the coolant channel that is more likely to affect the temperature of the wafer W may have different channel cross sections in the inner zone Z1 and in the outer zone Z2. Alternatively, the upper layers 61u and 62u may be replaced with the layers of the upper layer channel 52, or the lower layers 61l and 62l may be replaced with the layers of the lower layer channel 58 to apply the present description to various forms.

In the above-described embodiments, a method for manufacturing the cooling plate 40 is not limited to a particular one, but may be the following, for example. Firstly, a middle plate and a lower plate made of metal (such as aluminium) are prepared. The lower plate and the middle plate have grooves on their flat top surfaces. The lower plate and the middle plate have flat undersurfaces. Subsequently, to close the groove of the lower plate, the top surface of the lower plate and the undersurface of the middle plate are bonded together by diffusion bonding, brazing, or soldering. Thus, the lower layer channel 58 defined by the groove of the lower plate and the undersurface of the middle plate is formed. Subsequently, an upper plate made of metal (such as aluminium) is prepared. The upper plate has a flat top surface and a flat undersurface. To close the groove of the middle plate, the top surface of the middle plate and the undersurface of the upper plate are bonded together by diffusion bonding, brazing, or soldering to obtain an integrated assembly. Thus, the upper layer channel 52 defined by the groove of the middle plate and the undersurface of the upper plate is formed. Finally, the inlet ports 52i and 58i and the outlet ports 52o and 58o are formed from the undersurface of the assembly toward the upper layer channel 52 and the lower layer channel 58, and the through-holes 27c to 29c that extend through vertically are formed to obtain an integrated cooling plate 40. With this method, an integrated structure is formed without using a material having low heat conduction such as resin, so that the cooling plate 40 having high temperature uniformity or cooling efficiency can be obtained. Here, the upper plate is bonded after the lower plate and the middle plate are bonded together. However, the order of bonding the plates is not limited to a particular one, and all the plates may be bonded together at a time. A method for manufacturing the ceramic plate 20 may be as follows, for example. Firstly, ceramic material granules (such as alumina granules) are laid on a die at a predetermined thickness, compacted, and fired to obtain a flat plate. On the obtained flat plate, the electrostatic electrode 25 is formed by printing. On the resultant flat plate, ceramic material granules similar to the above are laid, compacted, and fired to obtain an electrode-embedded flat plate. On the obtained electrode-embedded flat plate, the heater electrode 22 is placed or formed by printing. On the resultant flat plate, ceramic material granules similar to the above are laid, compacted, and fired to obtain the ceramic plate 20. The electrostatic chuck heater 10 may be manufacturing by holding the adhesive sheet 30 between the obtained ceramic plate 20 and the cooling plate 40, performing heating or pressing as appropriate, and bonding the ceramic plate 20 and the cooling plate 40 together.

In the above-described embodiment, the upper layer channel 52 has the inlet port 52i at the outer periphery and the outlet port 52o at the center, but the inlet port and the outlet port may be reversed. As illustrated in FIG. 11, the inlet port 52i and the outlet port 52o may be arranged side by side at the outer periphery, and the channel closer to the inlet port and the channel closer to the outlet port may extend parallel to each other to a halfway mark at the center. The upper layer channel 52 is arranged spirally, but instead of being arranged spirally, the upper layer channel 52 may be arranged in a zigzag manner. The same holds true for the lower layer channel 58 and the first and second channels 61 and 62.

In the above-described embodiment, the coolant channel 50 has a multi-layer structure including upper and lower layers throughout the entire area over which the ceramic plate 20 is disposed. However, the coolant channel 50 may partially have a single-layer structure. For example, it may have a multi-layer structure only at the outer periphery, or only at the center. Instead, the coolant channel 50 may have a multi-layer structure including three layers stacked vertically.

In the above-described embodiments, the cross-section area or the cross-sectional shape of each coolant channel may be changed in the middle (any point between the inlet port and the outlet port) of the channel. For example, the channel cross section may be increased at the portion that requires improvement in temperature drop to facilitate flow of the coolant, so that the flow rate of the coolant is enhanced, and the temperature drop is improved.

In the above-described embodiments, in the ceramic plate 20, the heater electrode 22 may be embedded in each of multiple zones into which the ceramic plate 20 is divided. These zones may coincide with the zones of the cooling plate 40. This structure enables cooling appropriate for each zone of the ceramic plate 20.

In the above-described embodiment, the heater electrode 22 and the electrostatic electrode 25 are embedded in the ceramic plate 20. However, it will suffice that at least one of the electrostatic electrode and the heater electrode is embedded in the ceramic plate 20. A RF electrode may be embedded in the ceramic plate 20.

In the above-described embodiment, the cooling plate 40 includes the through-holes 27c to 29c as through-holes. However, one or more of these may be omitted. Alternatively, a gas hole that allows a He gas or other gas to be fed therethrough or an insertion hole into which a sensor is inserted to measure the temperature of the ceramic plate 20 may be formed in the surface of the ceramic plate 20 as a through-hole.

The present application is based on and claims priority from Japanese Patent Application No. 2019-038891 filed Mar. 4, 2019, the entire contents of which is incorporated herein by reference.

What is claimed is:

1. A wafer placement apparatus, comprising:
    a ceramic plate having a top surface including a wafer placement surface, the ceramic plate allowing at least one of an electrostatic electrode and a heater electrode to be embedded therein; and
    a cooling plate disposed on an undersurface of the ceramic plate opposite to the wafer placement surface to cool the ceramic plate,
    wherein the cooling plate includes a coolant channel, and the coolant channel has a multi-layer structure at least partially including a first layer and a second layer stacked vertically, the first layer and the second layer being spaced different distances apart from the wafer placement surface, and
    wherein, in the coolant channel, one portion of the first layer is located closer to the ceramic plate on a first side of a border of a plurality of zones into which the cooling plate is divided and another portion of the first layer is located further from the ceramic plate on a second side of the border, the portions of the first layer are continuous with each other and are connected with a first communication portion, wherein one portion of the second layer is located further from the ceramic plate on the first side of the border and another portion of the second layer is located closer to the ceramic plate on the second side of the border, the portions of the second layer are continuous with each other and are connected with a second communication portion, and wherein the first layer and the second layer are vertically switched with each other at the border.

2. The wafer placement apparatus according to claim 1, wherein, in the coolant channel, an outlet port of the second layer located further from the ceramic plate on the first side of the border is disposed near an inlet port of the first layer located closer to the ceramic plate on the first side of the border, and an inlet port of the second layer located closer to the ceramic plate on the second side of the border is disposed near an outlet port of the first layer located further from the ceramic plate on the second side of the border when the cooling plate is viewed in a plan.

3. The wafer placement apparatus according to claim 1, wherein the cooling plate has no heater.

* * * * *